United States Patent
Fasshauer (10) Patent No.: US 7,969,166 B2
(45) Date of Patent: Jun. 28, 2011

(54) METHOD AND CIRCUIT FOR DETECTING THE PRESENCE, POSITION AND/OR APPROACH OF AN OBJECT RELATIVE TO AN ELECTRODE

(75) Inventor: Peter Fasshauer, Neubiberg (DE)

(73) Assignee: Ident Technology AG, Wessling (DE)

( * ) Notice: Subject to any disclaimer, the term of this patent is extended or adjusted under 35 U.S.C. 154(b) by 336 days.

(21) Appl. No.: 12/091,769

(22) PCT Filed: Oct. 30, 2006

(86) PCT No.: PCT/EP2006/010430
§ 371 (c)(1),
(2), (4) Date: Sep. 4, 2008

(87) PCT Pub. No.: WO2007/048640
PCT Pub. Date: May 3, 2007

(65) Prior Publication Data
US 2009/0219039 A1    Sep. 3, 2009

(30) Foreign Application Priority Data

Oct. 28, 2005  (DE) .......................... 10 2005 051 834
Jun. 6, 2006   (DE) .......................... 10 2006 026 192

(51) Int. Cl.
    G01R 27/26   (2006.01)
(52) U.S. Cl. ..................................... 324/663; 324/662
(58) Field of Classification Search .................. 324/663, 324/658, 649, 600
    See application file for complete search history.

(56) References Cited

U.S. PATENT DOCUMENTS

| 3,103,655 | A | 9/1963 | Jones ........................... 340/551 |
| 3,798,551 | A | 3/1974 | Cake ......................... 340/825.69 |
| 4,358,749 | A | 11/1982 | Clark ............................. 340/38 |
| 4,661,797 | A | 4/1987 | Schmall ....................... 340/561 |
| 5,231,359 | A | 7/1993 | Masuda ........................ 324/675 |
| 5,801,340 | A | 9/1998 | Peter ............................. 178/19 |
| 6,081,185 | A | 6/2000 | Portet ....................... 340/426.36 |
| 6,960,841 | B2 * | 11/2005 | Saitou et al. .................. 307/10.1 |
| 7,358,746 | B2 * | 4/2008 | Clauss et al. .................. 324/663 |
| 7,368,921 | B2 * | 5/2008 | Deangelis et al. ............ 324/661 |
| 2008/0277910 | A1 * | 11/2008 | Thompson et al. ........... 280/735 |

FOREIGN PATENT DOCUMENTS

EP    398728 A2 * 11/1990

* cited by examiner

Primary Examiner — Hoai-An D Nguyen
(74) Attorney, Agent, or Firm — Andrew Wilford (57) ABSTRACT

A circuit for detecting the presence, position or the approach of an object in an observation area, the circuit has a sensor electrode assembly with an electrode that forms part of a capacitor system whose capacitance relative to a reference potential (e.g. ground) is dependent on the presence, position or approach of objects in the observation area. An evaluation circuit coupled to the sensor electrode detects a phase shift of the capacitance of the condenser system. An LC network is coupled to the capacitor system, and an oscillator connected to the electrode applies a frequency to the system formed by including the electrode and the LC network at a frequency within the range of a parallel resonance frequency of the LC network.

4 Claims, 10 Drawing Sheets

METHOD AND CIRCUIT FOR DETECTING THE PRESENCE, POSITION AND/OR APPROACH OF AN OBJECT RELATIVE TO AN ELECTRODE

CROSS REFERENCE TO RELATED APPLICATIONS

This application is the US national phase of PCT application PCT/EP2006/010430, filed 30 Oct. 2006, published 03 May 2007 as WO 2007/048640, and claiming the priority of German patent application 102005051834.6 itself filed 28 Oct. 2005 and German patent application 102006026192.5 itself filed 6 Jun. 2006, whose entire disclosures are herewith incorporated by reference.

The invention relates to a method and a circuit for detection the presence, position and/or approach of an object, in particular limbs, in or into an observation area. The invention particularly also relates to a method and a circuit for carrying out the corresponding detection based on field-electric interaction effects.

Proximity or touch sensors are known, in which the detection of a presence is carried out based on field-electric interaction effects. An instrumental factor for this is an electric property of the human body, consisting in the fact that when near a signal electrode that is supplied with a voltage as opposed to ground the conductive body influences the electric field formed by the signal electrode. A quantitative description of this effect is stated in capacitances, since the body radiates a coupled field away from the body due to its conductivity, thus forming a significant grounded capacitance of normally approximately 120 pF to 150 pF. In this manner, the body changes the capacitance of a signal electrode by approach or touch. The capacitance of the signal electrode often determines the frequency in known detection systems. The approach can be detected by frequency measurement.

One problem in this regard is the sensitivity required for certain applications, and the fault resistance of the method. In the detection of the smallest of body parts, such as a finger, low capacitance changes of 0.01 to 0.1 pF, which still have to be detected, are often the result. The obtainable sensitivity is determined by the relative capacitance change as opposed to the base capacitance of an oscillator, which should be as low as possible, in turn necessitates a high oscillation frequency that may be critical due to the EMV problem on one hand, and also against interference potentials on the other hand.

The object of the invention is to provide a solution enabling the approach of an object, particularly of a live body, to a sensor electrode in a more sensitive and simultaneously safer manner than in previous approaches.

This object is solved according to the invention by a circuit for the detection of the position and/or presence of an object in an observation area, comprising:
  a sensor electrode assembly comprising an electrode that is part of a capacitor system whose capacitance to a reference potential (e.g. ground) is dependent on the presence or position of objects in the observation area,
  an evaluation circuit coupled to the sensor electrode assembly,
  an LC network that is coupled to the capacitor system, and
  a generator for supplying the system that includes the electrode and the LC network with a frequency in the range of a parallel resonant frequency of the LC network.

This circuit enables the determination of an approach of an object to the sensor electrode with high accuracy and reliability.

Preferably, the evaluation circuit is configured and constructed such that it detects an approach of an object to the sensor electrode assembly by a change of the resonance behavior. According to a particular aspect of the present invention, the change of the phase position of a comparison signal from the LC network as opposed to a comparison signal from the area of the generator is detected as the change of the resonance behavior. The signal obtained from the area of the generator may be the generator potential, or particularly also a generator trigger signal.

The LC network itself preferably comprises at least one inductor and at least one capacitor for forming a parallel resonant circuit.

The coupling of the oscillator signal with the sensor electrode preferably occurs in a capacitative manner, and serves for operating the parallel resonant circuit near the parallel resonant frequency.

The evaluation circuit is preferably configured such that it detects a change of the capacitance of the capacitor system based on a phase shift. Alternatively, or particularly advantageously, it is also possible to configure the circuit such that a change in capacitance of the capacitor system is detected based on an amplitude change on the chronological course of the current, or on the voltage in the parallel resonant circuit.

The invention relates to a vehicle door-lock system having a circuit of the type described above.

The invention further relates to a safety system having a circuit of the type described above.

The invention also relates to a position-detection system having at least one circuit of the type described above, wherein one or more sensor capacitor systems are provided from which distance information can be obtained.

According to a further aspect of the present invention, the invention also relates to a method of detecting the presence of an object in an observation area using a capacitor system whose capacitance is dependent on the presence of the object in the observation area, where a system comprising a sensor electrode, and an LC network coupled to it is operated in this method by applying an exciter at a frequency near the parallel resonant frequency of the LC network, and a change of the phase of the exciter as opposed to a resonance is detected in the resonant circuit.

Instead of the phase of the exciter, it is also possible to utilize the phase of a comparison signal being obtained from a reference LC network. The resonance behavior of the two LC networks to each other is influenced by the change of the dielectric properties in the environment of the sensor electrode. This may be evaluated by a change of the phases of the signals to each other.

It is possible to vary the exciter frequency. The change of the exciter frequency may be depending on phase. The requirement of changing the exciter frequency may be evaluated as a presence signal.

According to a particular aspect of the current invention it is possible to compensate for systematic changes of the capacitance of a capacitor system formed including the sensor electrode in a defined manner. Such systematic changes may occur, for example, if the sensor electrodes are to be used in cooperation with motion systems (e.g. window-opening devices, sliding roofs, convertible top assemblies, seat positioning systems, doors, hatches, particularly trunk lids). The purpose of such electrodes may be the detection of extremities in injury relevant zones. The systematic changes in the capacitance of the sensor electrode capacitor systems may be taken into consideration in that the LC network compensation operations comprising the sensor electrode are processed in same. These compensation operations can be processed particularly via circuit sections using a varactor diode system and/or a gyrator system. These approaches make it possible to operate the system near a parallel resonant frequency even with changes of the capacitance of the capacitor system including the sensor electrode due to actuating operations, and thus to detect event detections at a substantially constant detection frequency by phase shift effects.

According to a particular aspect of the invention it is possible to operate the system permanently near an advantageous system frequency via the compensation circuits (i.e. varactor diode, and gyrator). The readjustment requirement at the gyrator or varactor diode system may then be interpreted as the detection event. In particular, a detection even can be detected if the adjustment requirement of the compensation system has dynamics different than are justified by the dynamics of a currently running actuating operation. An error event, or an object approach can be detected if the diversion of the actuating requirement at the compensation system deviates by a certain (possibly varying after a function) amount from a diversion arising with a proper actuating operation with regard to the readjustment requirement of the compensation system.

It is possible to also detect the approach status of an object sensor to the electrode by adjustment requirements of the compensation system. The circuit approach can be selected such that the LC network is always operated with parallel resonance, or at a certain phase shift of the excitation event as opposed to the resonance vibration, and that an adjustment is made for maintaining the phase shift (or for realizing a defined shift state) on the side of the resonance system. This adjustment requirement may be used as the evaluation basis for the statement of the current approach state.

Thus tracking of the generator frequency is carried out in an advantageous manner in order to adjust changing capacitances, which may occur in moved objects, such as windows and sliding roof tops. The dynamic adjustment of the sensor curve to the movement while maintaining the phase rise has the advantage that the detection sensitivity of the system remains intact during a movement or actuation operation.

Preferably an increase of the quality factor of the resonant circuit determines the sensor sensitivity via like-phase feedback by a capacitance to the resonant circuit, causing it to be attenuated, and thus an increase of the quality, or the sensitivity, of the sensor.

An in-phase feedback automatically results also by using a shield of the electrode connected to the resonant circuit as opposed to a reference potential, such as ground, or in case of vehicles, the chassis, if this shield is coupled in phase. Due to a capacitative coupling between the electrode and the shield a feedback effect is created that leads to the attenuation of the resonant circuit and therefore to an increase of the sensor sensitivity in an advantageous manner with a suitable dimensioning of the assembly.

It is possible to replace the spool as inductor by an active circuit, which is used, for example, to transform a capacitance into an inductance (gyrator).

It is possible to position the circuit according to the invention in direct proximity to the zone to be observed by the sensor electrode for providing the LC network such that extensive, and possibly shielded, connecting lines can be omitted between the sensor electrode and the coupled LC network.

In this case, only that information can be exported as the detection basis, for example, at which frequency the system is running, and which capacitance, and/or inductance is currently adjusted in the coupled LC network tuned to the parallel resonant frequency. Deviations of the dynamics of the tracking of actuating operation related dynamics of the feedback can be interpreted as the detection event and the degree of feedback can be interpreted as information on the actual approach.

Feedback may occur by adaptation of the generator frequency and/or adaption of the properties of the resonant circuit. Preferably, the change is adjusted such that the systematic, e.g. the actuation operation related changes can be compensated.

Further details and characteristics of the invention are obvious from the following description in connection with the drawings. Therein.

Figure 1A:
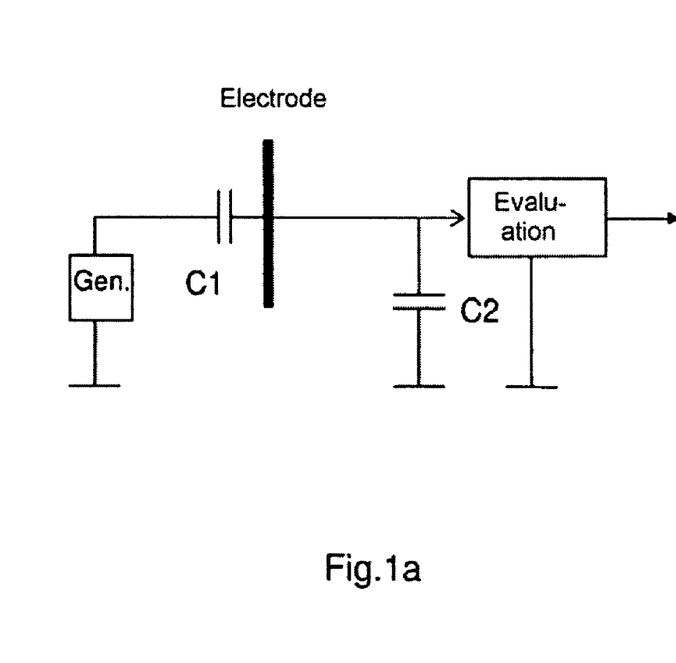
FIG. 1a is a schematic view of a circuit illustrating the basic configuration of a capacitance approach sensor system.

One concept for detecting the approach of a body to a sensor electrode is to connect a signal generator to an electrode via a capacitor C1, the electrode being also connected to an evaluation unit (FIG. 1a). Due to an input capacitance C2 of the evaluation unit a capacitive potential divider is created in this manner, which attenuates a potential at the input of the evaluation electronic unit supplied by the generator by the factor $$k = C1/C1+C2. \tag{1}$$

In, for example, C1=1 pF and C2=10 pF, approximately 9% of the generator potential is received at the input of the evaluation unit.

Figure 1B:
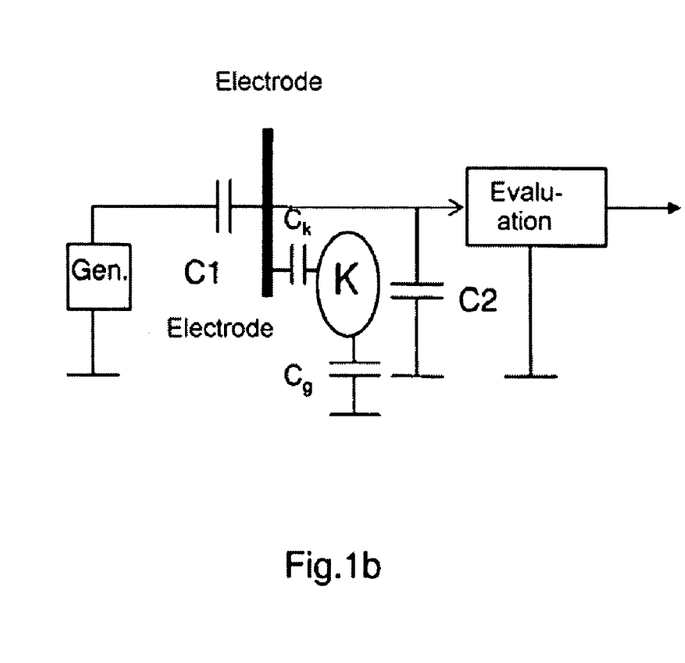
FIG. 1b is a schematic view of a circuit illustrating the electric relationships of the system according to FIG. 1 in the presence of an object in the observation area.

If a body part K approaches the receiving electrode, as illustrated in FIG. 1b, the input capacitance C2 increases to a higher value C2*=C1+Ck via the body coupling capacitance Ck and the ground capacitance Cg of the body, since Cg>>Ck must always be assumed. The potential division factor is therefore $$k^* = C1/C1+C2+Ck. \tag{2}$$

For a coupling capacitance of the body of, for example, Ck=0.1 pF, the receiving potential therefore changes by approximately 1%. The sensitivity of the assembly is relatively low.

The sensitivity is increased by a multiple in that an LC network is arranged at the input of the evaluation electronic system. In the simplest case it comprises a capacitor, to which an inductor L is switched in parallel, thus creating the resonant circuit illustrated in FIG. 2a. With adjustment of the generator frequency to the resonance frequencies of this network a potential is created due to the increase of resonance at the evaluation input, which can even be greater that the generator potential so that it can be adjusted to substantially lower values than in the case of the assembly according to FIG. 1.

Figure 2A:
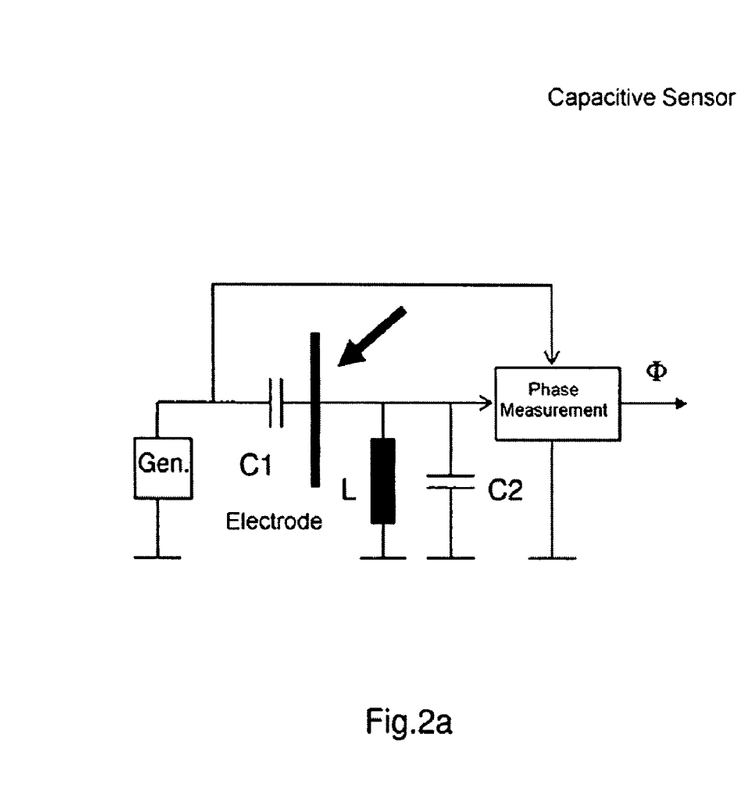
FIG. 2a is a schematic view of a circuit illustrating the basic configuration of a capacitance approach sensor system having a sensor system comprising an LC network that is coupled to the sensor electrode.
Figure 2B:
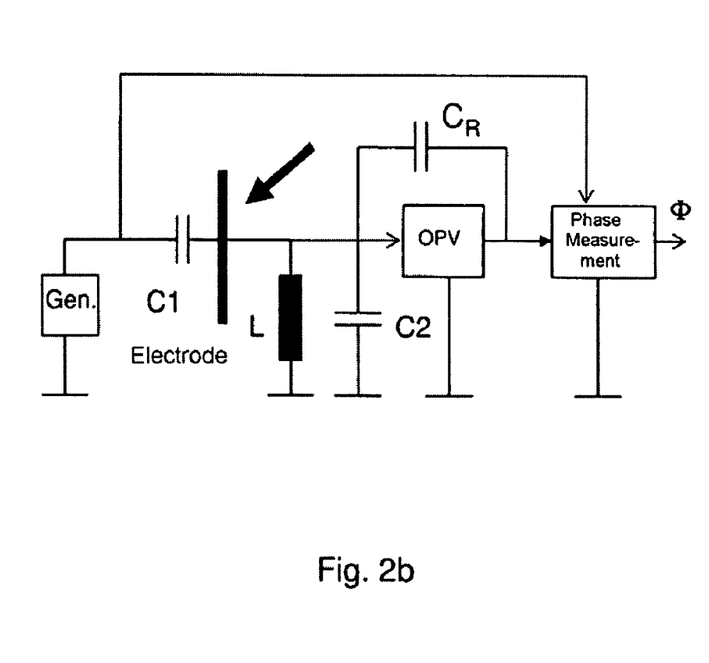
FIG. 2b is a sensor system with feedback for increasing sensitivity.

The substantial advantage of the assembly according to FIG. 2a is that the sensitivity to capacitance changes can be increased by the body by a multiple as opposed to current methods, in that a resonant circuit is detuned from the originally adjusted resonance due to the change in capacitance, and an amplitude change and phase shift regarding the generator signal supplied is the result. Both signal parameters may be used for an indication of an approach of a body. Most advantageously, however, the phase position is utilized, since there is no dependency on any amplitude changes on the generator side, and furthermore a much larger sensitivity with regard to capacitance changes is obtained. Further, the potential at the resonant circuit can be held low with use of the phase method, which has an advantageous effect on the field emission at the signal electrode, thus reducing the EMV problem with regard to the radiation emission.

Furthermore, a phase method is principally also less sensitive to interferences from outside on the receiving side than an amplitude method. In case of interference, filtering also occurs with the method due to the narrow-band resonant circuit, and the influence of the interference can further be reduced by selecting a high receiving potential. It is also of advantage to use a simple, purely digital method for the measuring of the phase shift, as will be described in further detail below. For the reasons stated, the phase method is therefore preferred, and will be described in further detail below.

The structure illustrated in FIG. 2a comprises a base variation of an LC network for a simplified illustration of the concept according to the invention. For this structure, the phase shift $\Phi$ is obtained from theory (e.g. in [1]) between the generator signal at the frequency f and the receiving signal from $$\Phi(f) = \arctan [1/Q(f/f_0)/(f/f_0)^2 - 1] \quad (3)$$

where Q is the quality factor of the circuit, and $f_0$ is the resonance frequency.

The result for the phase rise in the resonance point is then $$d\Phi/df = -2Q/F_0 \quad (4).$$

It is obvious from G13 that with a resonance the phase shift is 90°.

The change of the phase near the resonance frequency is larger according to G1.4, the higher the quality factor Q is. This is the reason for the high sensitivity of the sensor. With a relative change of the capacitance of $$\Delta\Phi = (\Delta C/C)Q \quad (5).$$

Figure 4:
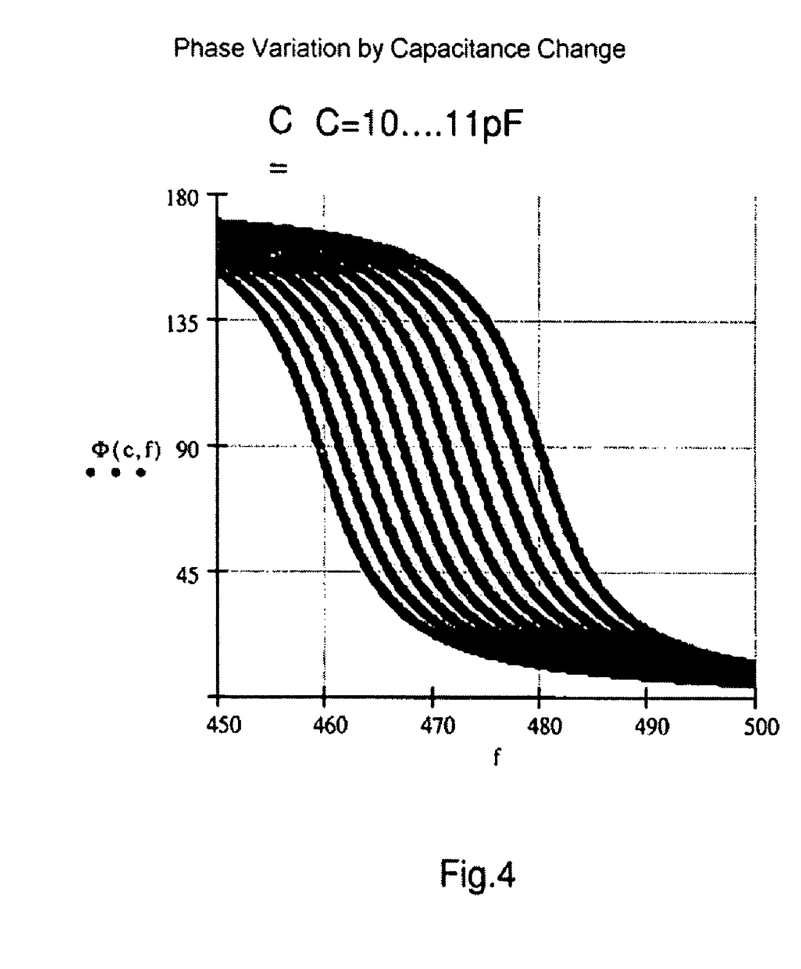
FIG. 4 is a diagram illustrating the phase shift with a variation of the capacitance.

The sensitivity of the sensor is proportional to the quality factor Q according to G1.5, and can be increased significantly by selecting a high value as opposed to currently known methods. For an example of C1=1 pF, C2−10 . . . 1 pF, L=10 mH, and Q=50, FIG. 4 shows the variation of the phase shift dependent on the frequency supplied, and on the capacitance change as a group parameter. With a resonance frequency of 480 kHz and a capacitance increase of 0.1 pF, a phase shift of 24° is obtained. The same change would only result in a value of approximately 1% in the case of an assembly.

Figure 3:
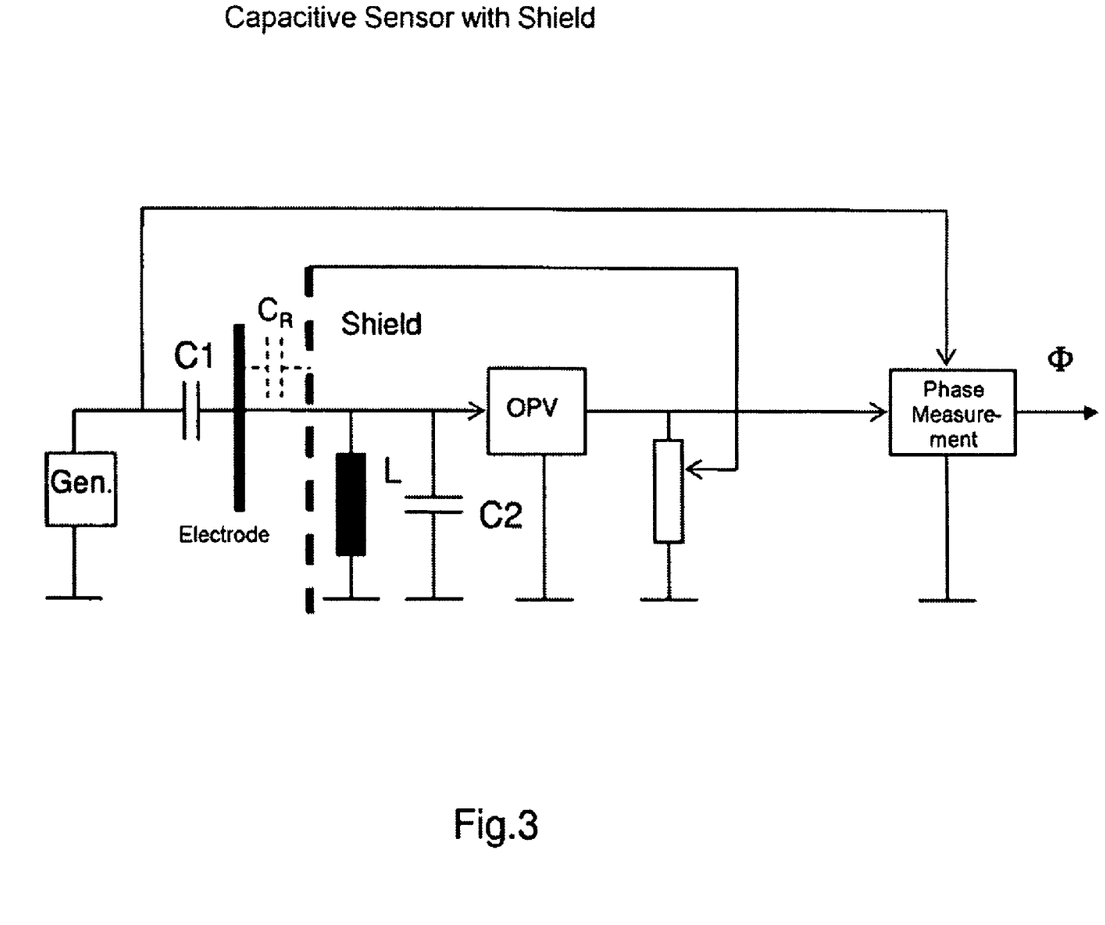
FIG. 3 is a sensor system with feedback due to an in phase actuation of a shield for shielding the electrode

The quality factor critical for the sensor sensitivity, which is mainly determined by the loss resistance of the spool, can be increased in that the potential applied at the resonant circuit is fed back in phase via an operation amplifier and a feedback capacitor $C_R$, thus attenuating the circuit, and increasing the quality. The same effect can be achieved with the use of a shield (FIG. 3) for shielding the sensor electrode from mass surfaces, since in this case a capacitative coupling occurs between the electrode and the shield.

Electronic Evaluation System

Figure 5:
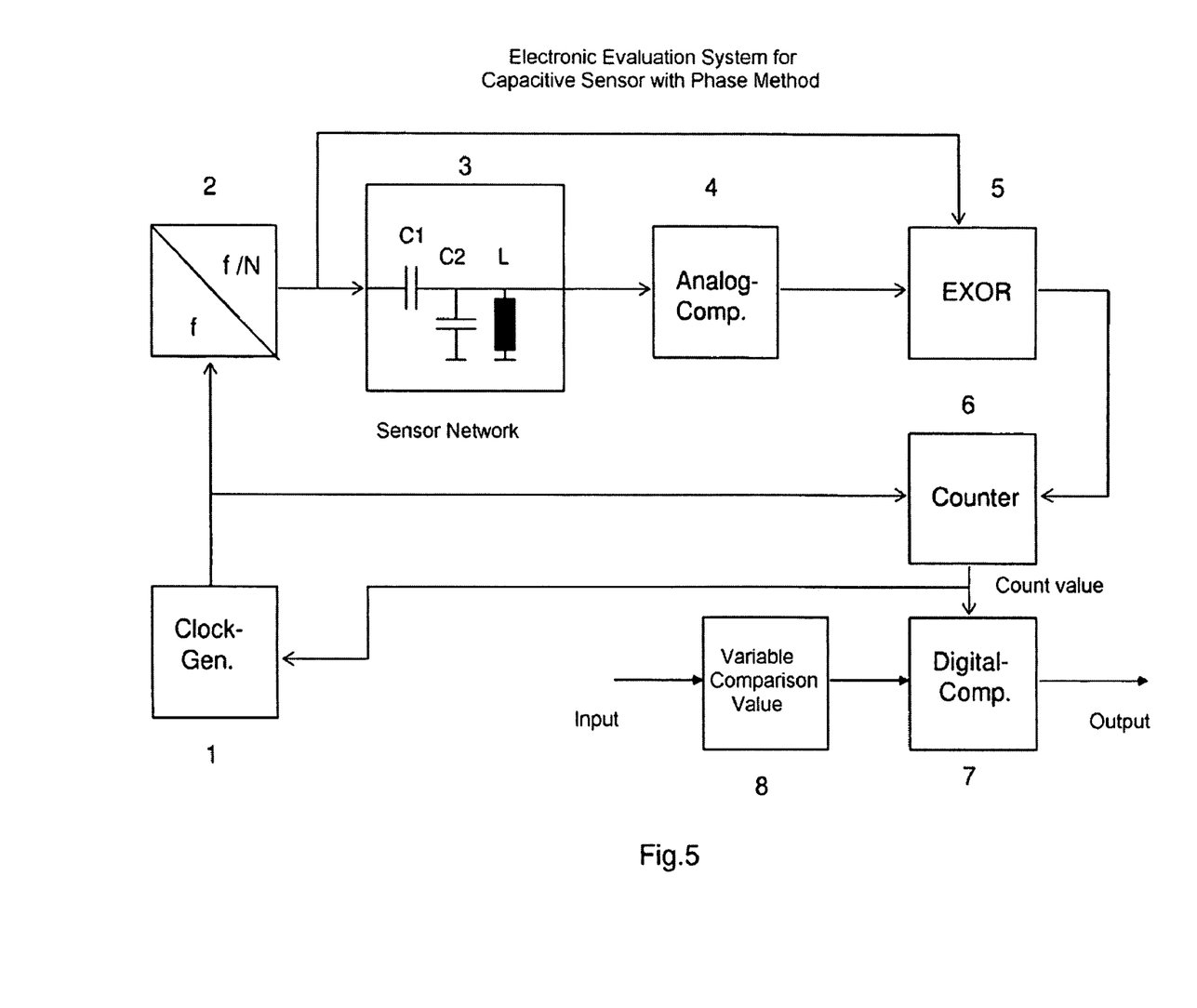
FIG. 5 is a block diagram illustrating the incorporation of the basic circuit according to FIG. 2a in an evaluation circuit.

An electric assembly will be described in further detail below, which can be advantageously utilized for evaluating the phase shift (FIG. 5). A clock generator 1 generates a clock pulse of typically 50 . . . 100 MHz, which is divided by a whole number N in a subsequent frequency divider 2 so that the resonance frequency corresponding to the network 3 according to FIG. 2 is generated.

In the example of FIG. 5 the division factor is N=104 at a clock frequency of 50 MHz and a resonance frequency of 480 kHz.

The output signal of this network, having a ground phase shift of 90° as described in the previous section, is fed to a comparator 4, and is subsequently linked to the signal generated in the divider 2 by an EXOR function, which corresponds mathematically to a multiplication of the two signals. In this manner, a digital signal is generated at the EXOR output having a frequency equal to twice the resonance frequency of the circuit, and an impulse width that is directly proportional to the phase shift of the sensor network 3. When evaluating this impulse width by a subsequent counter 6, which counts the clock signal during pulse duration, the counting result is an image of the phase shift generated by the sensor network. The count value supplied by the counter can then be compared to a value read-in at 8 by a digital comparator 7, and therefore issue an indication signal that corresponds to a certain phase change, or an approach state of the body. Another possibility of evaluation is to filter the output signal of the EXOR gate via a lowpass filter, thus generating a direct current proportional to the phase shift, which can then be evaluated by an AD transformer and a microcontroller.

In order to compensate for long-term drifts of the clock generator or in the network, it is possible to readjust the frequency of the clock generator by the count value, or by the direct current obtained so that an output phase shift of 90° is always adjusted at the sensor network in idle mode. The approach of the body is then detected merely as a change of the count value, thus resulting in a differentiating function of this evaluation.

Advantage of the Invention and Use

The great advantage of the explained assembly according to FIG. 5 is to put the entire evaluation electronic system in a single microcontroller in connection with only one inductor selected according to resonance, in order to therefore obtain a very sensitive proximity sensor in an extremely simple, space-saving and cost-effective manner.

A typical application is, for example, the installation of this sensor in the handle of a vehicle door in connection with a keyless access function, the network capacitances C1 and C2 being formed in the handle by respective electrode assemblies. Further, the concept according to the invention also makes it possible to provide sensors for monitoring danger zones, such as motion gap at window, convertible top, door, or trunk lid systems. The electrode assemblies may also be embodied flat, or in a wire-like manner. They may also be formed by electrically appropriate components, which as such, have additional functions (i.e. door handle).

The electrode assemblies may also be utilized as interface electrodes for further signal transfers. The signal applied to the electrode can, for example, be used to transfer this signal to a receiving unit via the body in order to detect whether the body is located in a certain position, which is characterized by the location of the receiver. In this manner, additional functions can be detected, such as the occupancy of a seat in a motor vehicle.

Figure 6:
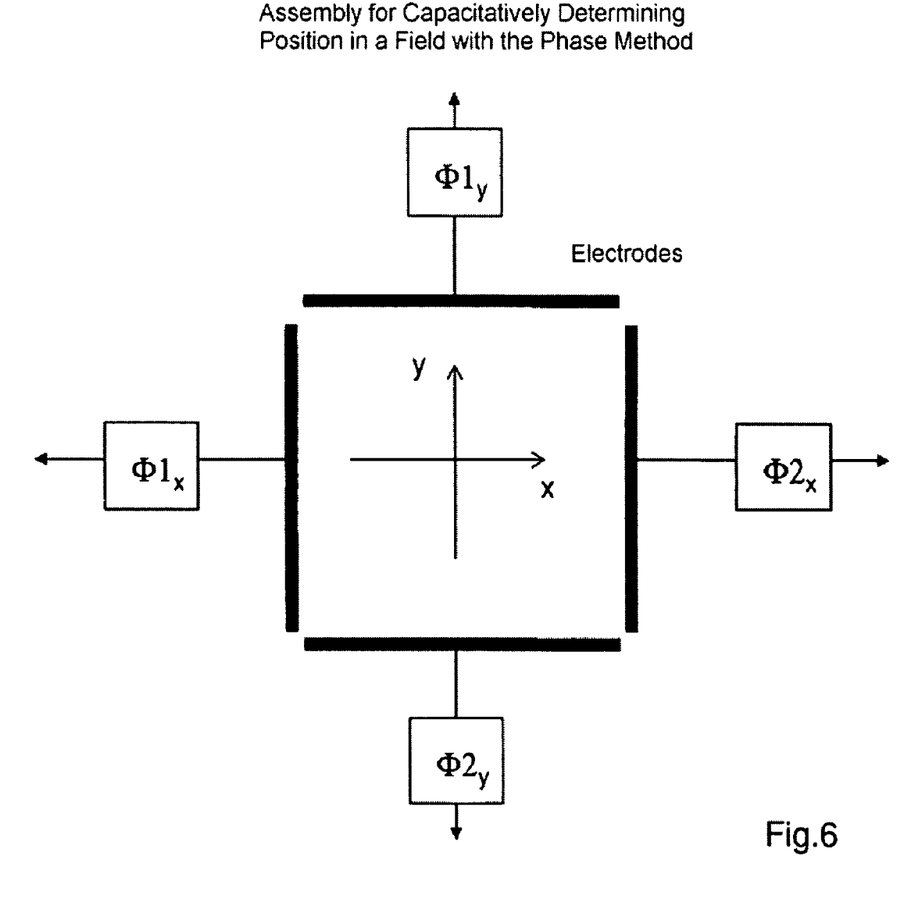
FIG. 6 is an electrode assembly for the X and Y coordinate detection according to the phase method.
Figure 7A:
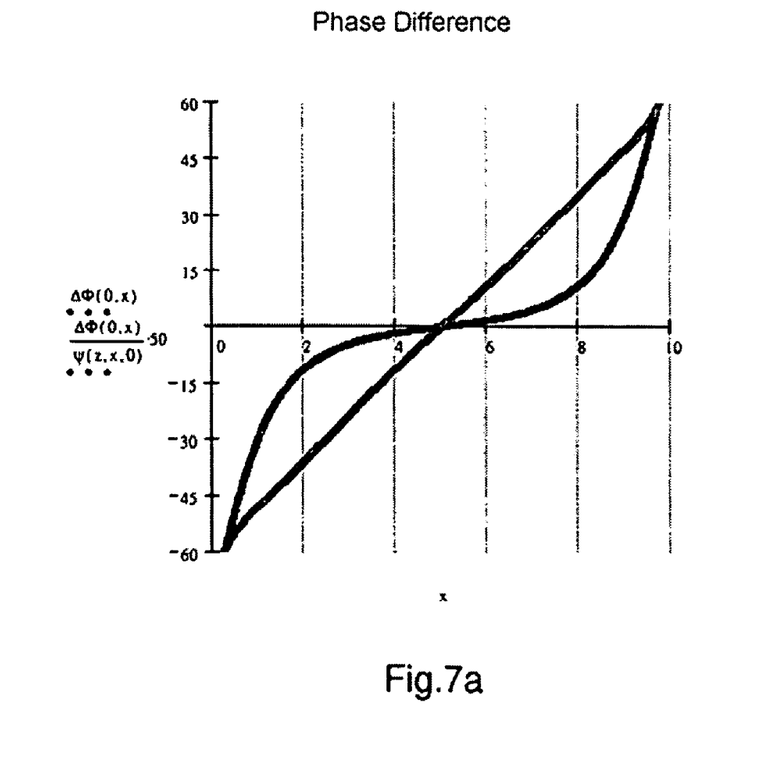
FIG. 7 is a diagram for illustrating linearization of the phase dependency on the position coordinate X.
Figure 7B:
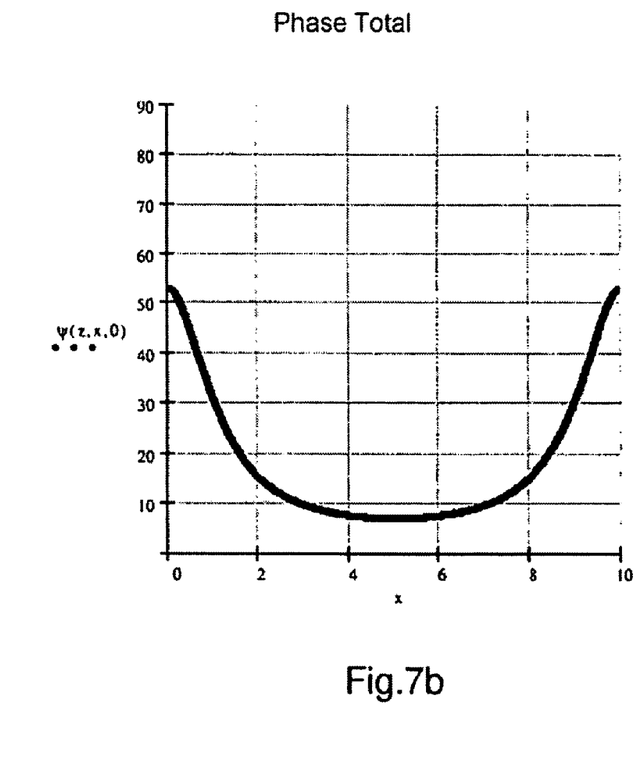

FIG. 6 shows a diagram of a position-detection system by which in particular a touchpad-like input field can be provided. To this end, the approach state to the respective X and Y-electrodes is determined based on an evaluation of the phase positions $\Phi x$ and $\Phi y$ in order to determine the position of a finger, for example, on the input field in the case of household appliances, and therefore in order to activate virtual keys, or also to enable display functions on screens in so-called gesture systems. For this purpose, the determination of the X and Y coordinates is required on the respective field. Advantageously, each of the phase difference $\Delta\Phi=\Phi 1-\Phi 2$ and the phase sum $\Sigma\Phi=\Phi 1+\Phi 2$ of the X and Y-electrode pairs is formed, thus making linearization of the coordinate determination possible, as shown in FIG. 7 in the example of the X coordinate. Initially, a non-linear course in dependency of X (FIG. 7a) is generally the result in the differential formation, which particularly leads to a relatively strong flattening in the center of the field. If a new function $\Psi=\Sigma\Phi-\Phi 0$ (FIG. 7b) is defined, and $$\Delta\Phi/\Psi=\Phi 1-\Phi 2/\Phi 1-\Phi 0 \qquad (6)$$

is formed with a suitably selected constant $\Phi 0$, the linearization illustrated in FIG. 7a is the result, which then leads to a simple determination of position due to the proportionality approaching the coordinate.

Figure 8:
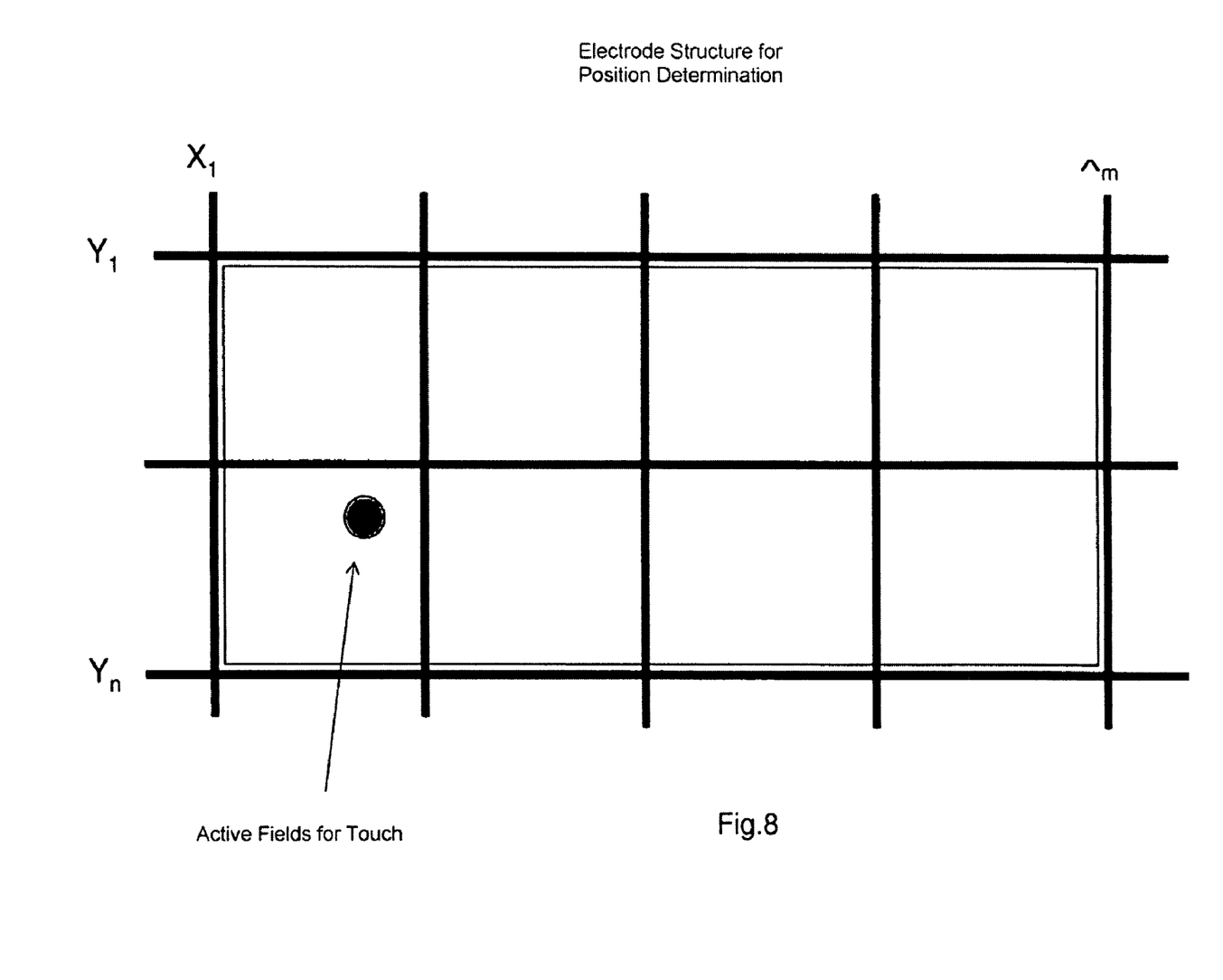
FIG. 8 is an electrode structure as a grid for improving accuracy in position determination in large surfaces.
Figure 9:
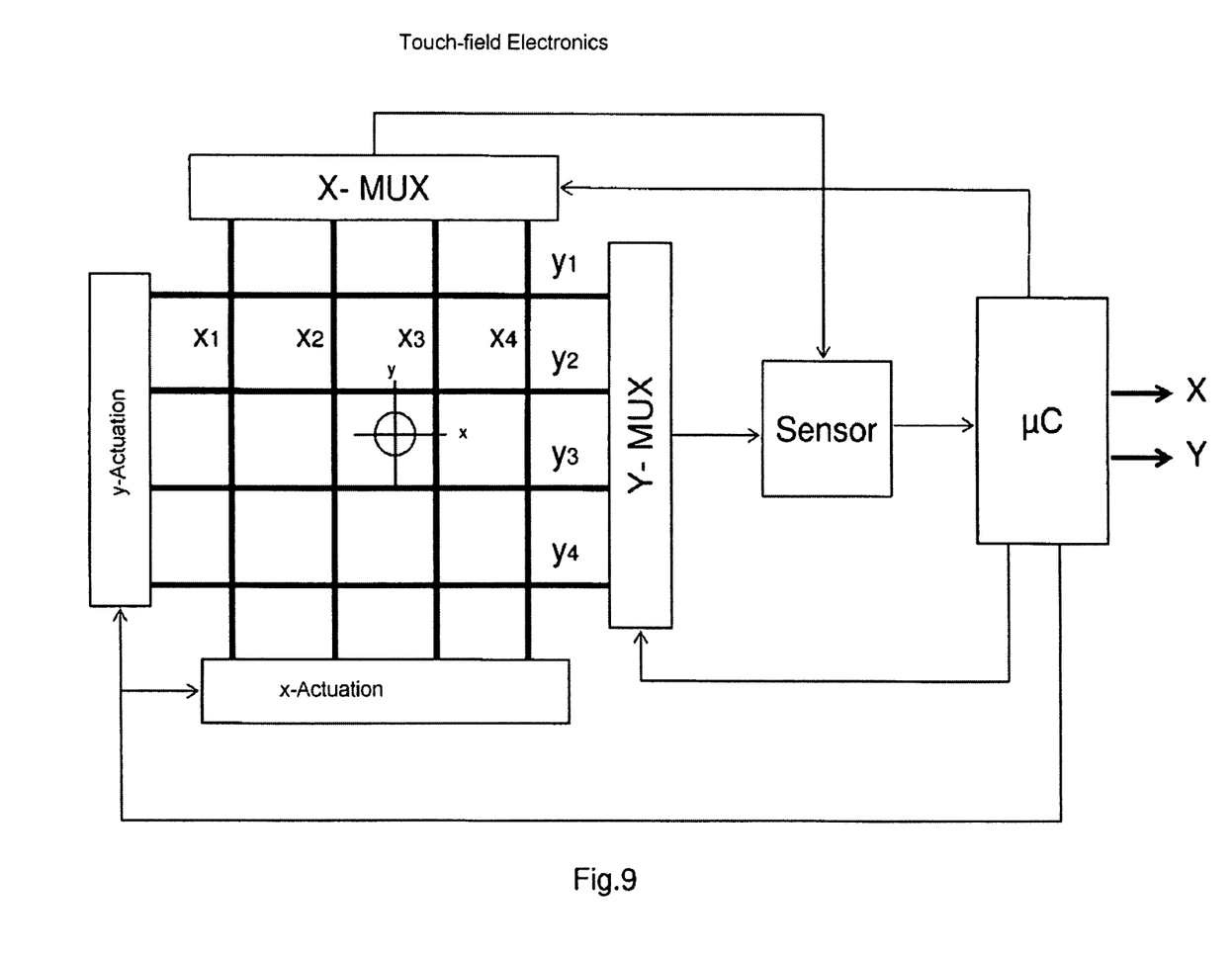
FIG. 9 is a block diagram for explaining a multi-channel detection system in which a determination of the approach state to multiple sensor electrodes occurs by successive determination of the phase positions at the LC network as opposed to the generator signal.

In order to enable the detection of position on a large surface with sufficient accuracy, an assembly of multiple electrodes, for example, in a grid-like structure, is necessary, as shown in FIG. 8. The evaluation of the associated phase information of the electrodes then occurs intentionally by a multiplexer according to the block diagram of FIG. 9, by which cost is kept low, since only one single-phase meter is necessary for all electrodes in this case. The determination of the position within the individual fields of the grid is carried out according to the same algorithm described above.

It is possible to also vary the generator frequency synchronously to the query of the individual electrodes so that certain base capacitances of the individual systems may be accommodated in this manner.

The generator frequency can further be adjusted to the respective systems within the course of a calibration cycle such that they may be operated within the range of the parallel resonance.

The circuit according to the invention is particularly also suited in an advantageous manner for protecting clamp gaps on motion systems, particularly in the automotive field for securing convertible top systems, windows, doors, and lids.

The respective electrodes can be integrated in the adjacent areas of the clamping-relevant edges. The electrodes can be integrated into functional parts, in particular levers, bars, or frames. They may be embodied in any desired shape as thin films or conductive paint structures, which may, for example, be applied to the body in an insulated manner, and can subsequently be painted over. This approach of an assembly of the electrodes may also be viewed as a self-sufficient concept of the invention independent of the previously described measures.

In summary, the assembly according to the invention provides the following advantages as opposed to current proximity sensors:

a substantially increased sensitivity with regard to capacitance changes by approaches;

a reduction of errors by large receiving amplitudes and selection by a narrow-band resonant circuit independency of amplitude variations by evaluation of the phase shift;

simple evaluation electronic system, having only few components; and evaluation by purely digital processing, having the possibility for implementation into a microcontroller or ASIC thus space-saving and cost-effective realization.

Figure 10:
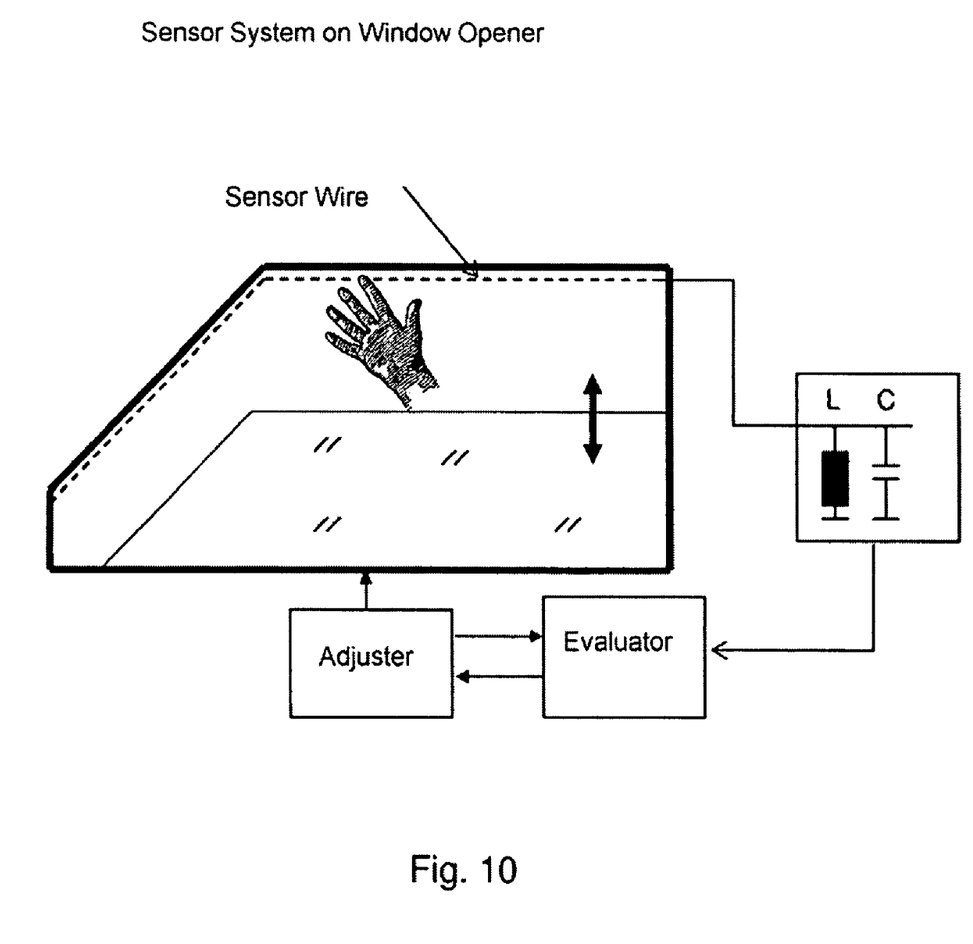
FIG. 10 is a schematic view illustrating the possible uses of the circuit device according to the invention in a window-opening unit for compensating actuating operation related, e.g. caused by the lifting of the pane, systematic and reliable changes of the capacitance of an LC sensor system formed including a sensor electrode (chain line).

FIG. 10 shows a schematic view for the purpose of illustrating the application possibilities of a circuit according to the invention in a window-opening device for compensation of systematic and admissible changes in capacitance of an LC sensor system formed by including a sensor electrode (chain line) due to actuation operations, e.g. caused by the lifting of the window pane. It is possible to correlate the dynamics of the tracking required for maintaining a certain phase position of the generator signal having the resonance in the parallel resonant circuit with the movement or speed information provided by a window-opening mechanism. If change requirements having greater dynamics with regard to the tracking requirement are the result, these are attributed to exterior influences, for example, to the approach of a hand, as illustrated.

The invention claimed is:

1. A circuit for detecting the position or presence of an object in an observation area, the circuit comprising:
    a sensor electrode assembly comprising a first electrode forming part of a capacitor system whose capacitance to a reference potential is dependent on the presence or position of objects in an observation area bordered by the first electrode,
    an LC network coupled to the capacitor system and including
    a parallel-connected inductor and capacitor forming a resonant circuit having a parallel resonance frequency,
    a gyrator establishing a predetermined inductivity of the LC network, and
    an operational amplifier and a feedback capacitor feeding back a potential of the resonant circuit,
    a generator for applying an exciter frequency to the first electrode and the LC network at a frequency within the range of the parallel resonance frequency of the LC network, and
    evaluating means coupled to the sensor electrode for tracking resonance behavior of the LC network in capacitance changes of the detection capacitor system including the sensor electrode.

2. The circuit according to claim 1 wherein the generator changes the exciter frequency occurs in dependence on the phase position.

3. The circuit according to claim 2 wherein the evaluating means evaluates a change of the exciter frequency as a presence signal.

4. The circuit according to claim 2 wherein the resonance frequency of the circuit is changed by the generator by changing the capacitance or the inductance, of circuit elements of the resonant circuit.

* * * * *